United States Patent [19]

Kackman

[11] 4,389,622
[45] Jun. 21, 1983

[54] SYSTEM FOR PREVENTING TRANSIENT INDUCED ERRORS IN PHASE LOCKED LOOP

[75] Inventor: Gerald M. Kackman, St. Paul, Minn.

[73] Assignee: Honeywell Inc., Minneapolis, Minn.

[21] Appl. No.: 306,272

[22] Filed: Sep. 28, 1981

[51] Int. Cl.³ .......................... H03L 7/08; H04L 27/12
[52] U.S. Cl. ..................................... 332/19; 331/1 A; 331/14; 331/DIG. 2; 375/120
[58] Field of Search ...................... 331/1 A, 14, 18, 25, 331/DIG. 2; 332/19; 375/62, 65, 120; 329/50, 122, 124

[56] References Cited

U.S. PATENT DOCUMENTS 3,906,376 9/1975 Bass ..................................... 329/104
3,908,115 9/1975 Waggener ............................ 235/152
4,068,181 1/1978 Clark et al. .......................... 328/133
4,112,383 9/1978 Burgert ................................ 329/50
4,122,405 10/1978 Tietz et al. ........................... 331/1 A Primary Examiner—Siegfried H. Grimm
Attorney, Agent, or Firm—Charles G. Mersereau

[57] ABSTRACT

A system for minimizing synchronization errors in a phase-locked loop having a sequential phase detector for determining the phase difference between the output of the VCO of the phase-locked loop and a periodic control signal. Control circuitry is provided so that the control signal is enabled as an input to said sequential phase detector for a relatively short time window which comprises a small fraction of the control signal cycle period beginning just before a control signal is anticipated and the signal is disabled for the remainder of said control signal cycle period. Provision is made for the phase detector to process only the first control signal in any given enable time window. Additional circuitry is provided to disable the control circuitry when the phase locked loop is detected to be out of lock.

26 Claims, 7 Drawing Figures

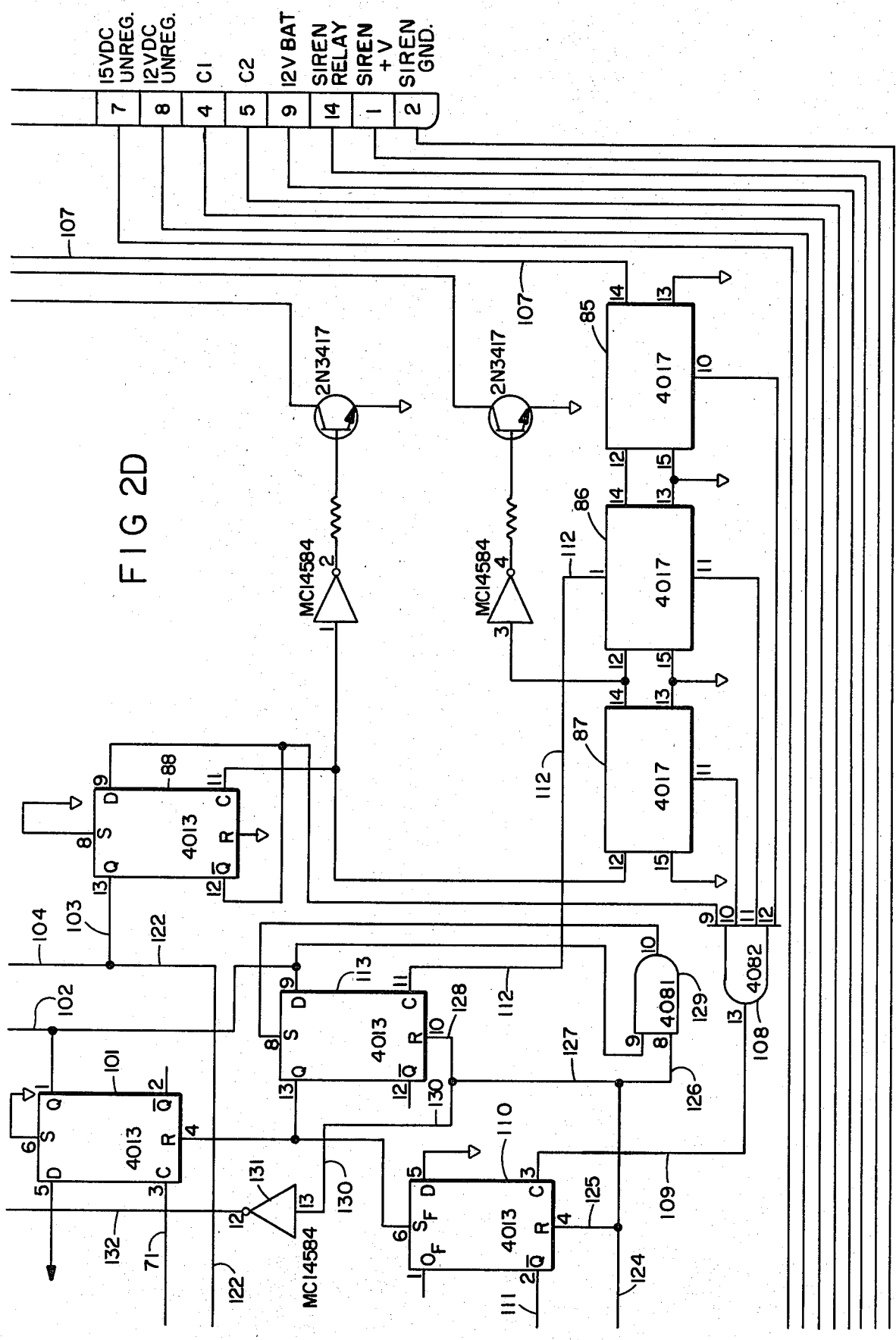

SYSTEM FOR PREVENTING TRANSIENT INDUCED ERRORS IN PHASE LOCKED LOOP

BACKGROUND OF THE INVENTION

1. Field of the Invention

The present invention relates generally to communication systems of the binary digital type and, more particularly, to a system that prevents spurious input control signals from producing errors in systems using sequential phase detectors in conjunction with phase-locked loop signal processing.

2. Description of the Prior Art

Many communication systems such as, for example, power line carrier systems use digital modulation techniques in signal transmission. Transmission of such signals is controlled by modulating the input to the transmitter system as by impressing on a carrier signal a train of pulses at given frequency intervals to indicate whether a "mark" or binary "1" or a "space" or binary "0" should be transmitted. One such digital transmission technique involves frequency shift keyed (FSK) modulation. This is the type employed in the preferred embodiment of the present invention.

In this type of a system, one frequency is used to indicate a mark and another to indicate a space. Frequency shift keying involves the modulation of the base or carrier frequency to shift its frequency by predetermined increments in response to particular data to be transmitted.

In such a system, the frequency shift phase is continuous, i.e. the transmitted signal is a sinusoidal signal which varies in frequency but has no time-phase shift continuity. Normally, a binary "1" or mark signal is transmitted at a frequency above a selected center frequency or "carrier plus" frequency and a space or binary "0" is transmitted at a frequency below the center frequency of the carrier or "carrier minus" frequency. The differential between a transmitted frequency and the center frequency of the carrier may be made equal to or greater than the modulation rate, or data rate, divided by two.

One well known method of controlling such a system to prevent phase shifting consists of applying the input signal to a phase-locked loop whose output is sampled once every bit period in accordance with a sample control signal which is generated in accordance with the bit period. The phase-locked loop circuit normally consists of a phase detector which compares the frequency of a VCO with that of the incoming control signal or reference-frequency generator. The output of the phase detector, after passing through a loop filter, is fed back to the VCO to keep it exactly in phase with the incoming or reference frequency.

An important component of any phase-locked loop, of course, is the phase detector. Basically, the phase detector provides a direct current output voltage which is related to the phase difference between the oscillator signal phase and that of a reference signal for use in controlling the oscillator to keep it in synchronism with the reference signal. The phase detector is extremely important in maintaining the phase lock to provide proper output from the phase-locked loop.

One important type of phase detector is known as a sequential phase detector. A sequential phase detector is a digital circuit which measures phase differences by observing the sequence of the transitions or "zero" crossings of the input signals. These are normally the leading edge or positive zero crossings. Sequential phase detectors are implemented with bistable elements or flip-flops to "remember the input sequence." Many implementations are possible. One sequential phase detector in common use is known as the sequential phase frequency detector.

Sequential phase detectors have often been used because they have many desirable qualities. They are simply and inexpensively implemented from readily available digital circuits. They can have high gain with very small phase errors. When used in phase-locked loops, they can eliminate the loop "hang-up" problem and provide rapid, reliable phase and frequency acquisition. Because no linear or discrete elements are used in the circuits, sequential phase detectors are particularly attractive for integrated circuit implementations.

However, sequential phase detectors including sequential phase-frequency detectors have one undesirable characteristic. Because these devices are transition operated circuits with memory, they are intolerant of missing or extraneous input transitions due to noise or other spurious signals in the input. Whereas with other types of phase detectors, a small extraneous transient signal will produce but a small transient phase error signal, in the case of a sequential phase detector, such extraneous or transient signals which involve a transition may produce very large error signals. Consequently, in phase-locked loop applications, the effect of noise transitions on a sequential phase detector will normally cause the loop to lose lock. In this situation, it may be many clock periods before the phase-locked loop is able to regain lock.

It can be seen from the above that there exists a need to eliminate the effect of extraneous transitions so that otherwise desirable sequential phase detectors may be used successfully in situations where such transitions often occur. One solution, for example, might be to filter the input signal to remove the spurious transitions. The inherent phase shift of such a filter, however, may also obscure the desired phase relationship. Such filters also normally require discrete components and linear elements which increase the cost and design problems of the associated circuitry and overcome the advantages of using the sequential phase detector in the first place.

SUMMARY OF THE INVENTION

By means of the present invention, problems associated with extraneous transitions or transients on the input control signal to sequential phase detectors, especially sequential phase detectors associated with phase-locked loops are solved by the provision of additional control circuitry to control the input signal to the phase detector such that the phase control signal input is enabled for only a small fraction of the control signal cycle period. This fraction of the control signal cycle period or small time window is selected to coincide with the time when a valid, i.e., non-extraneous control signal is expected in the normal control signal cycle. The system is implemented such that the phase detector responds only to the first such control signal and ignores subsequent signals during the time the input is enabled. The input enabling function is controlled by timing circuitry which disables other circuit components at the end of the enablement period thereby disabling the the phase detector input. The input is caused to remain disabled for the period of each control cycle until the time of the next enable time window when the next valid input signals are expected. In this manner, the phase detector input is enabled for only a small time window during each input cycle. Spurious input transitions occurring outside of the time window are blocked and signals in addition to the first received control signal are ignored and thus do not disturb the loop. Additional circuitry is provided to disable the control circuit, if necessary, should an out-of-lock situation occur. This enables the phase detector input until phase lock is regained.

In the preferred embodiment, a phase locked frequency divider operated from the VCO is utilized to obtain the necessary timing and sequential sequencing signals. This is used on combination with gates and bistable elements to achieve the desired control. The VCO, in turn, is driven by a phase-locked frequency multiplier operating from the control signal input which is normally 60 Hz line voltage. The use of the phase locked frequency multiplier technique has the additional advantage that the disabled time is not a fixed value but changes automatically as the input signal frequency changes. This allows more flexibility in the system.

BRIEF DESCRIPTION OF THE DRAWINGS

In the drawings, wherein like numerals are utilized to designate like parts throughout the same:

FIG. 2, which includes FIGS. 2A, 2B, 2C, and 2D is a schematic wiring diagram of an FSK transmitter using a phase detection system in accordance with the invention.

DESCRIPTION OF THE PREFERRED EMBODIMENT

Figure 1:
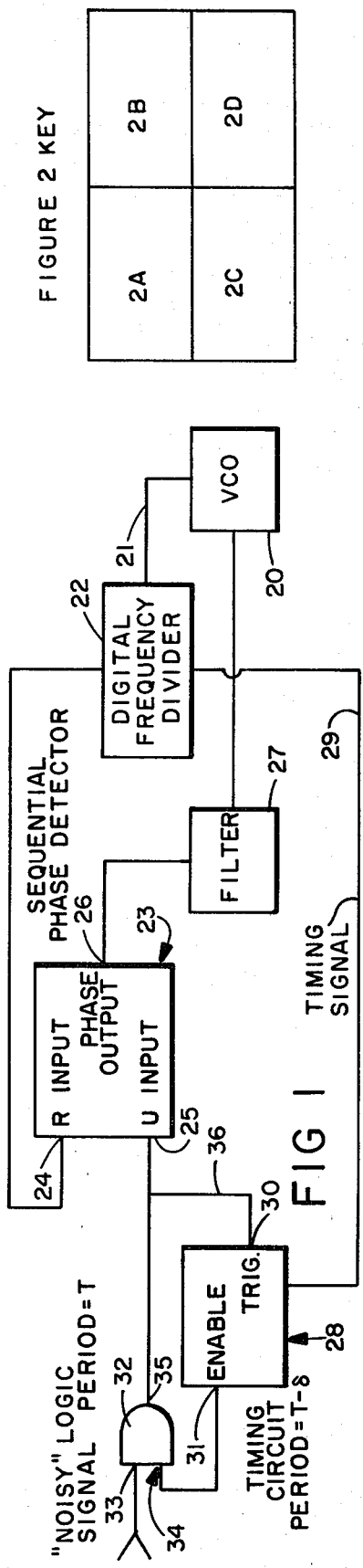
FIG. 1 is a simplified block diagram of a phase detector input control circuit in accordance with the invention.

In FIG. 1 there is shown a simplified block diagram of a blanking or disabling circuit in accordance with the preferred embodiment of the present invention. This includes a VCO 20 having an output conducted via 21 to a digital frequency divider 22 which in turn provides a counted-down input to a sequential phase detector 23 at 24. This sequential phase detector also has a control or sample signal input at 25 and a phase difference signal output at 26 which is filtered at 27 and used to control the VCO.

A timing circuit 28 which may contain bistable flip-flop circuits and gates controlled by the frequency divider which inputs timing signals to the system via conductor 29 has a reset trigger 30 and an output or enable signal at 31. When AND gate 32 receives the raw or "noisy" input logic control signal at 33 and the enable signal input at 34 it is enabled and produces an output signal to the sequential phase detector at 35. After the desired enable period has elapsed the enable signal is turned off and the system is reset, with the input to the phase detector 23 disabled by trigger 30 via conductor 36.

The operation of the system, which will be explained in greater detail below, is basically as follows. After the frequency divider has counted down through one distable period of the timing circuit 28 or T-δ, where δ is a very small time increment, in relation to T, the output at 31 and, thus, the input 34 to AND gate 32 goes high. During the interval when this occurs, the receipt of any positive crossing transition signal will cause input 33 to go high enabling the logic signal input to be transmitted through AND gate 32 to the input of the sequential phase detector 23. This input together with the input from the frequency divider 22 at 24 is utilized to yield a voltage related to the phase difference as an output at 26. That signal is filtered and returned to drive the VCO. The period of the distable timing circuit (T-δ) is deliberately made slightly shorter than the normal period of the input logic signal (T) which equals the countdown time of the frequency divider 22. In this manner the AND gate 32 is enabled for only a fraction or small window of the countdown time during the interval when a valid input signal should appear at input 31. During the rest of the cycle time, the enable output 31 of the timing circuit 28 is in the OFF or low state and the AND gate 32 is therefore also off.

As can be seen from the schematic key diagram, the overall FIG. 2 consists of four sheets of drawings labeled 2A, 2B, 2C, and 2D which fit together as illustrated. The combination of these four sheets of drawings then yields the overall schematic wiring diagram of a transmitting unit utilizing the system of the present invention. The preferred embodiment will now be described with reference to this combined schematic drawing as a typical application.

Figure 2A:
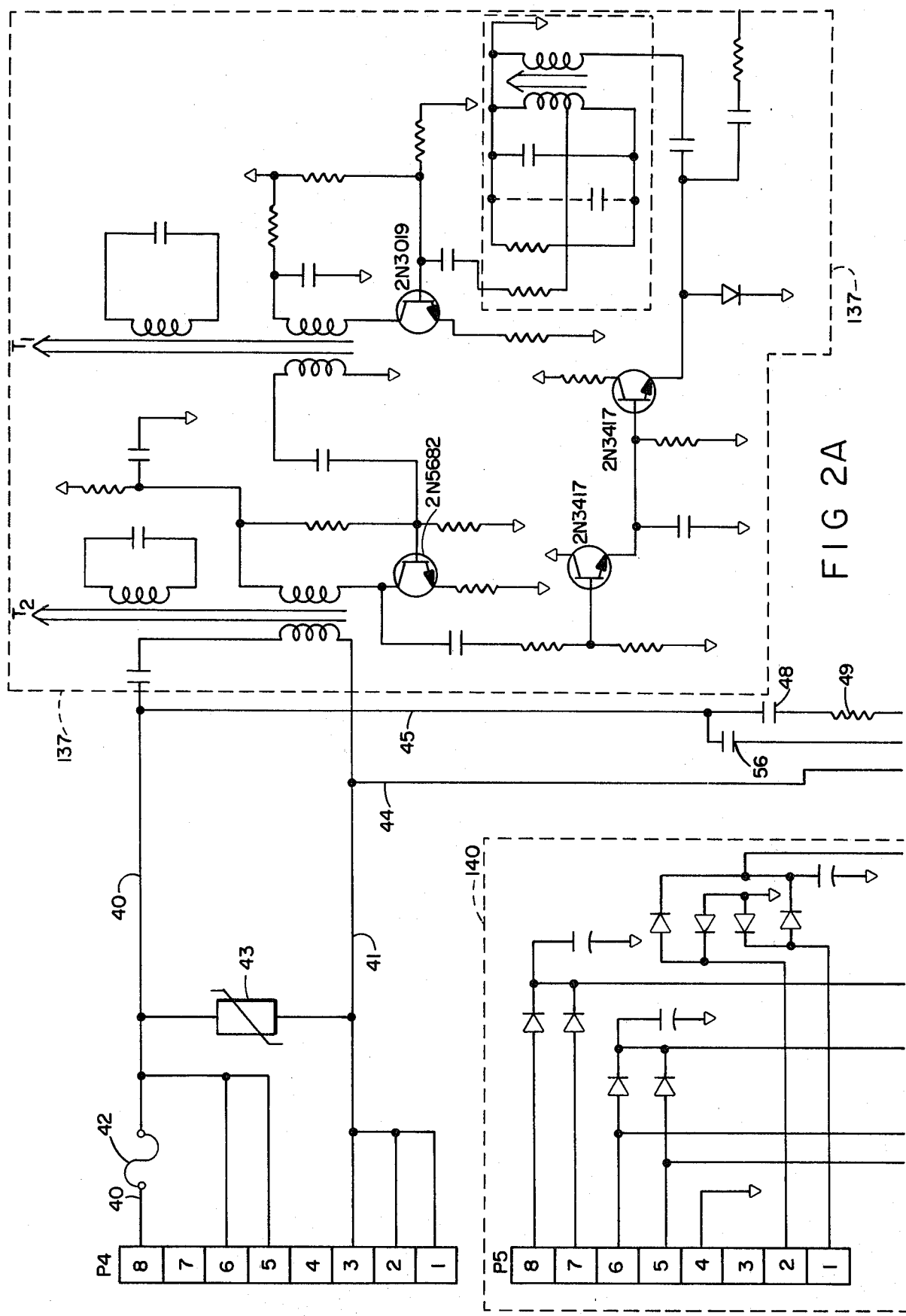

In FIG. 2A we see 60 Hz line-voltage power input conductors which carry the digital logic signals from the transmitter on lines 40 and 41 suitably fused at 42 and also containing a voltage limiting device for the circuit at 43. This feeds input lines 44 and 45. The comparator or detector current obtained from the power line, then, is basically a 60 Hz periodic sine wave which is used as the control signal for the phase-locked loop. The detector or comparator circuit shown in FIGS. 2A and 2C contains an amplifier 46 and its associated components and is used to detect the zero-crossings of the input signal and to generate a digital waveform whose positive transitions are observed in the output pin 6 of inverter or NOT gate 47. This voltage is caused to go high responsive to a positive zero crossing in this particular embodiment where the phase comparison is based on a positive zero crossing.

The power may be obtained for the detector circuit from lines 45 and 46 as by means of a capacitively coupled half-wave rectified power supply circuit including capacitor 48, resistor 49, diodes 50 and 51, and capacitor 52. The output voltage of the supply is regulated at a maximum of, for example, 28 V DC via a regulating circuit including Zener diode 53 and diodes 54 and 55. A coupling and attenuation network including the capacitor 56 (FIG. 2A), resistor 57, capacitor 58, and resistors 59 and 60 couple the line voltage signal to the comparator circuit. In this configuration, the line voltage is attenuated about 18 to 1 to maintain the signal within the operating range of the amplifier 46. Diode clamps 62 and 63 are utilized to protect the amplifier 46 from over voltages. The comparator/amplifier circuit also utilizes hysteresis by means of resistors 64 and 65 along with diode 66 in order that element 46 is caused to switch at, in this embodiment, 0 volts for a positive going signal and at −30 volts for a negative going signal. This hysteresis reduces the degrading effect of line voltage transients going positive to negative and the presence of "spikes" on the circuit operation. An isolator system, shown by the dotted enclosure 67, including diode 68 and transistor 69, may be used to couple the line frequency zero-crossing signal to the logic and provide electrical isolation between the power line and the ensuing transmitter electronic circuitry.

It is readily seen from the above that the signal at output pin 6 of NOT gate 47 will go high any time a positive zero-crossing is sensed and thus may contain extraneous transitions due to noise and transients on the power line signal. This "raw" control signal forms one input to AND gate 70. When AND gate 70 is enabled, of course, this causes a signal or logic "1" to appear at the output of AND gate 70 on line 71. This becomes an input signal in the phase detecting system which will be discussed below.

Figure 2B:
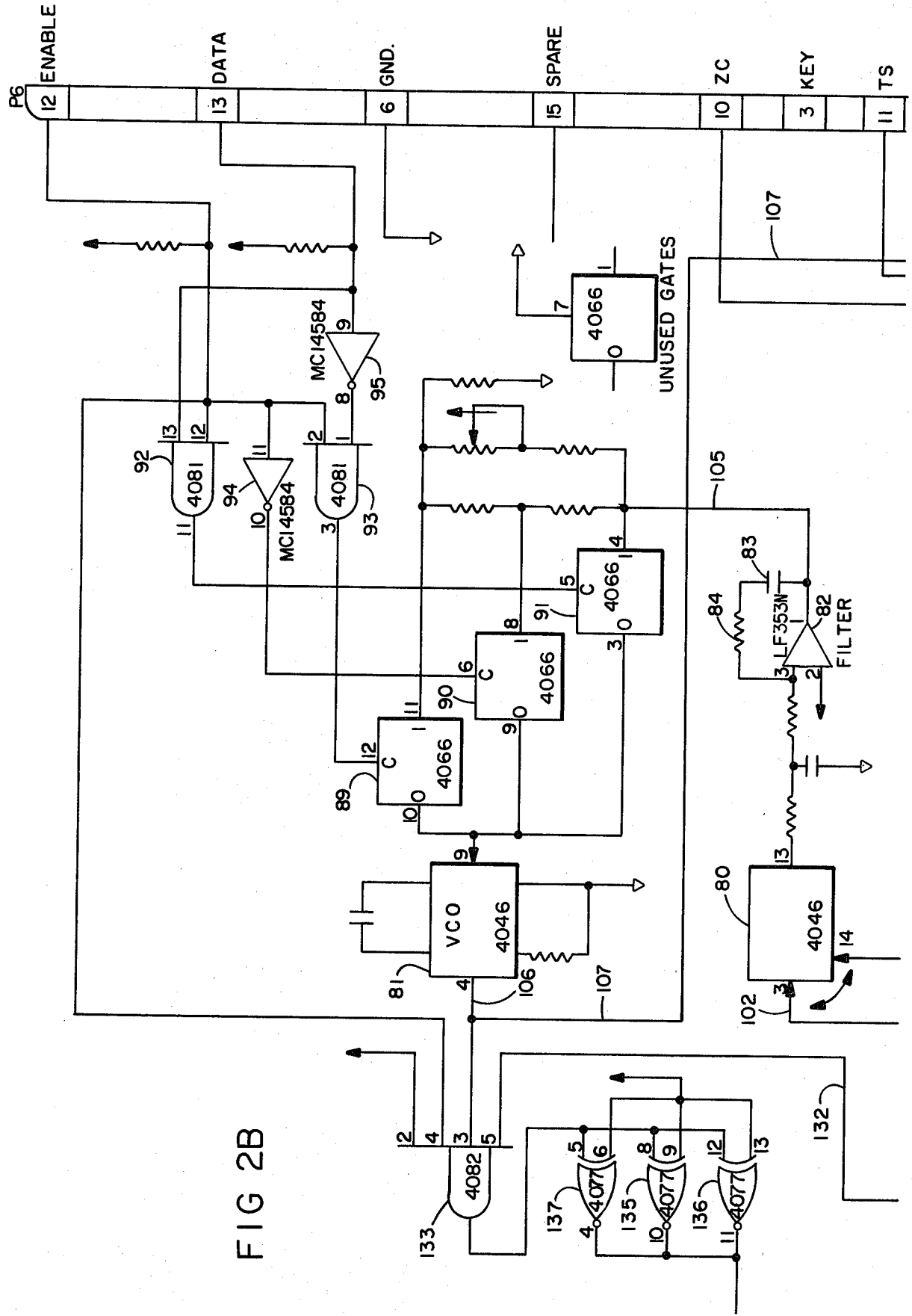
Figure 2C:
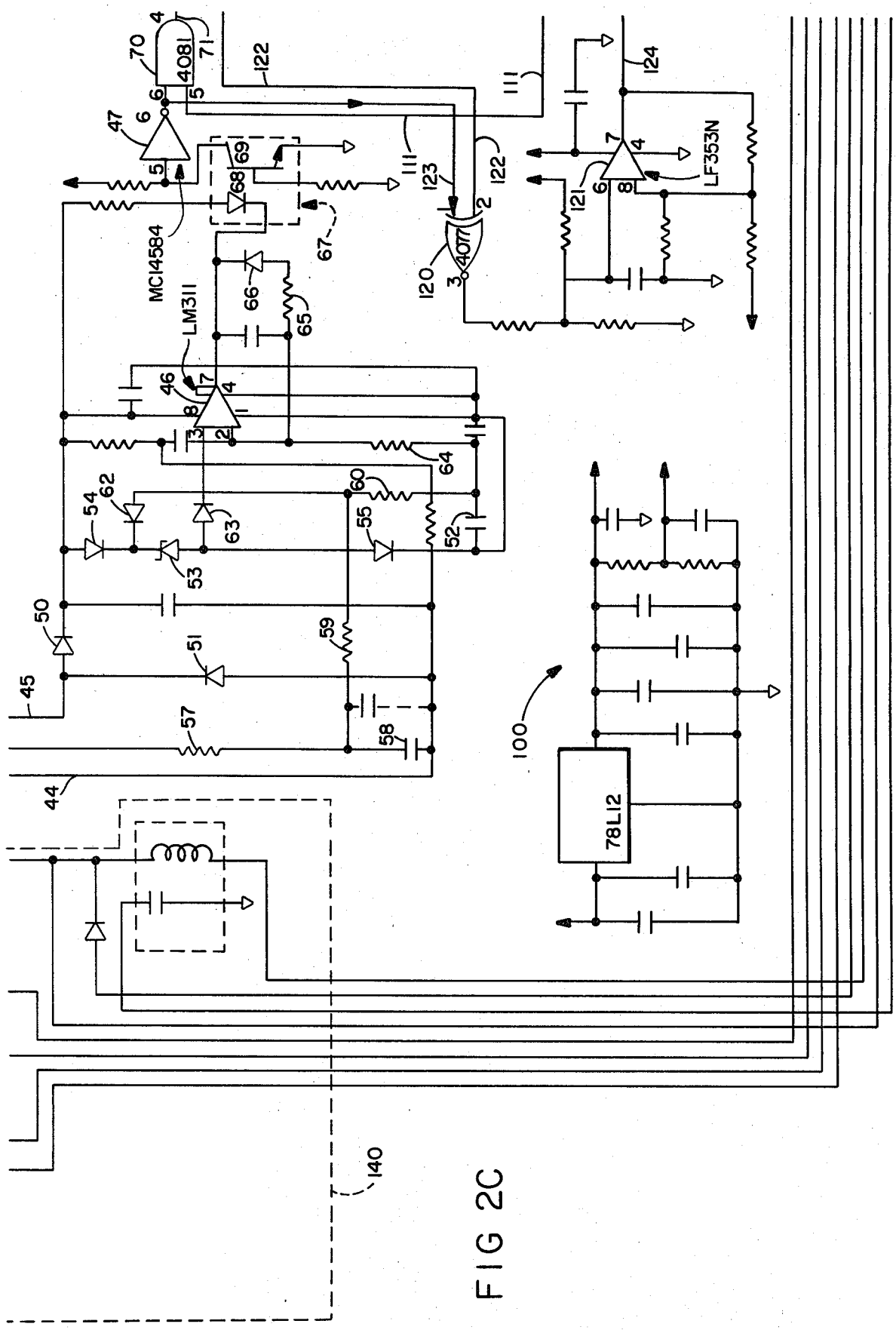

The phase-locked loop which is shown in FIG. 2B may be one such as a standard Motorola MC14046B and includes a phase detector 80 and a VCO 81 along with other components. Additional devices include a loop filter having an amplifier 82 along with capacitor 83 and resistor 84. A frequency divider (FIG. 2D) including counting circuits 85, 86, and 87, together with a bistable flip-flop circuit component 88 which is also used as a divider. A modulator circuit having analog gates 89, 90, and 91 together with associated control circuitry including AND gates 92 and 93 along with NOT gates 94 and 95 are provided. These components are relevant to the use of the phase-locked loop in conjunction with controlling a transmitter rather than to the present invention and operated in a well known manner which will be discussed in more detail in conjunction with that system. In addition, as shown in FIG. 2C, regulated DC voltages are supplied where needed in the circuitry from a regulated voltage supply system 100 which also operates in a conventional manner.

The frequency multiplier circuit will now be described. As seen in FIGS. 2B and 2D the unknown or raw control input logic signal at the output of AND gate 70 becomes the control input to a bistable element or flip-flop 101. Upon receipt of the first such signal, the flip-flop 101 changes state and produces the input logic "1" signal through its Q output to one input of the phase detector 80 via conductor 102. The phase detector 80 measures the instantaneous phase difference between the unknown input signal from the output of the flip-flop 101 and the counted-down reference signal from the VCO from the Q output of flip-flop 88 arriving via conductors 103 and 104 at input pin 14 of the phase detector. Output pin 13 of phase detector 80 produces a phase-difference related voltage signal which is filtered and proceeds via conductor 105 through the signal modulating system to the VCO control input pin 9. The VCO output from pin 4 proceeds via conductors 106 and 107 to the frequency divider or counting down circuitry including frequency dividers 85, 86, 87, and flip-flop 88 to again provide the phase-locked loop input to the phase detector.

It should be noted that if the loop is locked, input signals to the phase detector 80 both from the control signal input and the frequency divider circuit will be equal or coincident in phase and frequency and the VCO will be operating at exactly the desired amount of countdown or division in the frequency dividing circuit times the unknown or input frequency. In one successful embodiment of the present invention, the counting down or dividing number utilized has been 2000. In this case, the VCO would be operating at 2000 times the unknown or input frequency. Thus, if the input or control signal is 60 Hz power, the loop should be locked at 60×2000 or 120 kHz.

In accordance with the present invention, in order to prevent spurious transitions or other noise signals on the unknown signal input from affecting the phase detector 80 and, as explained above, driving the loop out of lock, an enabling and disabling control circuit is provided which disables the phase detector input for almost the entire cycle time between expected valid input signals which in this embodiment are positive zero crossings of the 60 Hz input current. If it be assumed that at the beginning the loop be locked, then for each cycle of the control input frequency, the frequency divider circuit should count 2000 cycles of the VCO signal. Thus, the normal counting sequence should be 0, 1, 2 . . . 1997, 1998, 1999, 0, 1 . . . etc.

The unknown signal transitions ideally should occur simultaneously with the 1999 to 0 transition of the counter circuit. Actually, due to loop noise and other system imperfections, as a practical matter there will be a small amount of distortion known as time "jitter" or dynamic phase error. This error may displace the transition slightly from the ideal position. The system of the present invention overcomes such dynamic phase error. In the case of a VCO operating at 2000 times the unknown frequency, it has been found that by enabling the system at the 1994 counting state of the frequency divider provides sufficient time, i.e., the six VCO cycles between 1994 and 0 (in this case 50 microseconds) before a correct or valid input transition is expected to overcome the normal amount of dynamic phase error in the circuit. This is implemented at the output from the counters 85, 86, and 87 is received at pins 10, 11, and 12 of AND gate 108 along with a signal from flip-flop 88 which is conducted to pin 9 of AND gate 108. These inputs decode the specified state of the frequency divider and determine when to enable the AND gate 108 as at count 1994.

The output of the AND gate decoder 108 is conducted by 109 to clock the control input at pin 3 of a flip-flop 110. This, in turn, causes the $\overline{Q}$ output at pin 2 of the flip-flop 110 to go high. This signal is conducted by conductor 111 to pin 5 of the AND gate 70 (FIG. 2C) setting it true and thereby enabling the output signal via line 71 to flip-flop circuit 101.

The first positive input transition or zero-crossing occurs at pin 6 of NOT gate 47 from the input signal. This transition passes through the AND gate 70 and will clock the flip-flop 101. Because the D input is high, the output of the flip-flop 101 at pin 1 goes high in response to the positive transition and this signal is then applied to the phase detector 80 at pin 3 via conductor 102. It should be noted that the D input at pin 5 of flip-flop 101 is a permanent digital "1". Consequently, any additional transitions clocked at input pin 3 cannot again change the state of the flip-flop and register another positive zero crossing at phase detector 80. The result is that only the first positive input transition that occurs after the counter reaches state 1994 affects the phase detector 80.

After a short period of time, when the counter reaches approximately 0060 of the next cycle, a signal is transmitted from the frequency divider counter 86 via conductor 112 to clock flip-flop 113 and resets the logic for the next synchronizing cycle. Thus, the Q output of flip-flop 113 at pin 13 goes high and resets flip-flop 101 and sets flip-flop 110 at pin 6. The $\overline{Q}$ output of flip-flop 110 at pin 2 also goes low and disables the AND gate 70 at pin 5 via conductor 111. It should be noted with regard to the resetting sequence that the sequence is controlled such that AND gate 70 is disabled prior to resetting flip-flop 101 so that the danger of the admission of any spurious input in that interim is avoided.

Figure 3:
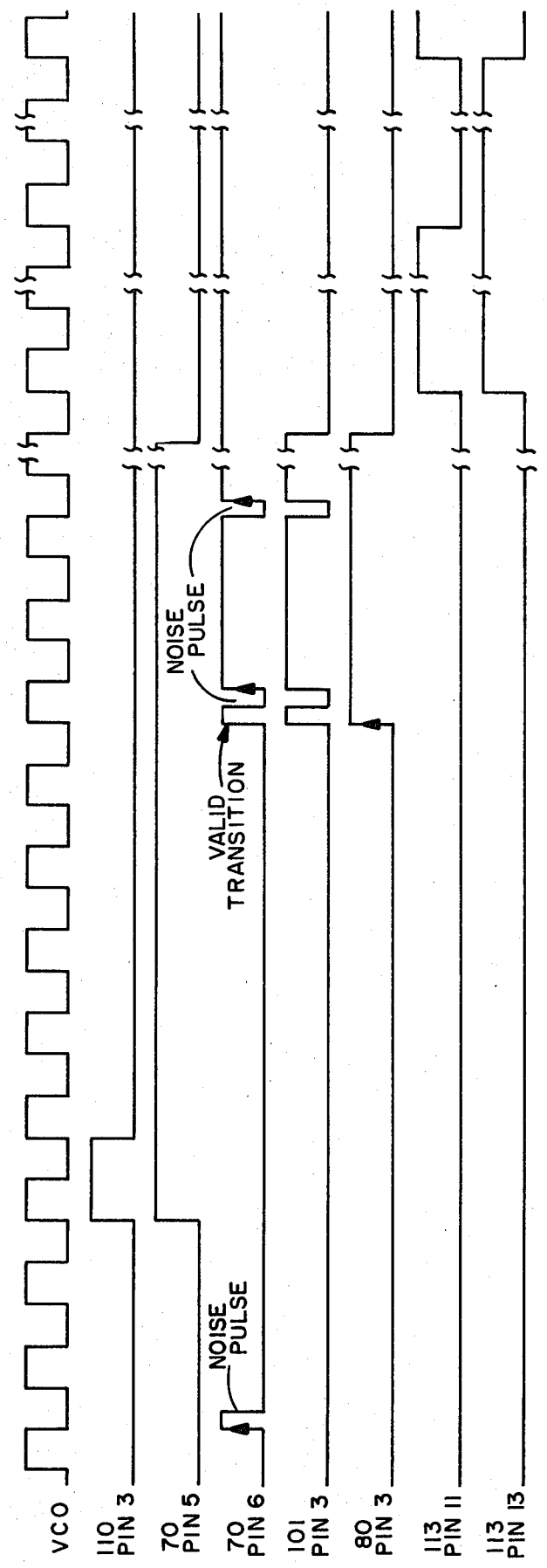
FIG. 3 is a timing diagram associated with the transmitter of FIG. 2.

The timing sequence can also be seen in FIG. 3 which focusses on a typical input enable period in the counting sequence. It can be seen that any spurious or noise pulses which occur when the pin 5 of the AND gate 70 is disabled will be ignored by the circuit. Likewise, any noise or spurious pulse after the receipt of the first, normally valid, transition during the enable period of AND gate 70 pin 5 will also be ignored by the phase detector 80.

Thus, in normal operation the phase detector input is disabled for 1994/2000×100%=99.7% of the time. Any extraneous signal transitions occurring during the disable period will be rejected by the circuitry. Any extraneous transition occurring during the enable period, however, will be accepted if it is the first such transition. Since these transitions occur almost at the correct time for a valid transition, however, and since the circuit will accept only one transition per cycle, the resulting phase error which occurs when a noise or other transient pulse occurs just before the valid transition pulse will be very small and the consequent circuit disturbance in the loop will be greatly reduced.

In the preferred embodiment, the timing for the control signal enabling and disabling circuit is derived from the VCO. The VCO frequency is known only when the loop is locked. If the loop is out of lock, the circuit may not operate correctly. In fact the loop may try to lock at a frequency other than the desired frequency. For this reason, it is necessary to disable the control signal enabling and disabling feature when the loop is unlocked. This is accomplished by overriding circuitry including an auxiliary phase detector shown in FIG. 2C as exclusive NOR gate 120 and a comparator 121 which detect an out-of-lock condition in the system. Exclusive NOR gate 120 receives inputs from the VCO from flip-flop 88 via conductor 122 and the raw input signal from NOT gate 47 via 123. In an out-of-lock condition, a signal from the output of exclusive NOR gate 120 causes the output at pin 7 of comparator 121 to go high. This signal is conducted via 124, 125, 126, 127, and 128 enabling AND gate 129 and resetting flip-flops 110 and 113. This disables the blanking circuit and impresses a continuous "1" signal on input pin 5 of AND gate 70. A signal is also conducted via 130 through NOT gate 131 and via conductor 132 to disable AND gate 133 thereby disabling the transmission of data during this interval. With the blocking circuit disabled, the loop will again normally lock at the correct frequency after a short interval.

The transmitter shown in the illustrated embodiment transmits by FSK modulation of the phase-locked frequency. This is accomplished by varying the VCO control voltage. This may be done by switching the input to the VCO 81 at pin 9 to different points or analog gates on the voltage divider. Utilizing a 120 kHz center or carrier frequency with a 122.4 kHz carrier-plus and a 117.6 kHz carrier-minus signal to transmit mark and space signals, respectively, as can be seen from the modulation circuitry of FIG. 2B, the output may be summarized in Table I.

| DATA INPUT | ENABLE | ANALOG GATE 91 | ANALOG GATE 90 | ANALOG GATE 89 | FREQ. VCO |
| --- | --- | --- | --- | --- | --- |
| 0 | 0 | OFF | ON | OFF | 120 KHz |
| 0 | 1 | OFF | OFF | ON | 117.6 KHz |
| 1 | 0 | OFF | ON | OFF | 120 KHz |
| 1 | 1 | ON | OFF | OFF | 122.4 KHz |

A representative FSK transmitter circuit is shown in FIG. 2A which may be any conventional system. The logic signal input section includes AND gate 133 along with parallel-connected exclusive NOR gates 134, 135, and 136, which amplify the output which in turn is coupled to an amplifier circuit shown enclosed in the dotted box at 137 which is connected to the powerline in conventional fashion. The system may be used to transmit signals from an alarm circuit as shown enclosed in dotted box 140 or have any other desired function.

It can be readily seen from the above that the transient blanking circuit in accordance with the present invention provides a simple and accurate means of greatly enhancing the usability of sequential phase detectors, and particularly sequential phase-frequency detectors in transmitter systems such as that shown and described herein.

The embodiments of the invention in which an exclusive property or right is claimed are defined as follows:

1. A method of minimizing synchronization errors in a phase-locked loop having a sequential phase detector for determining the phase difference between the output of the VCO of the phase-locked loop and a periodic control signal having a characteristic control signal cycle period, wherein said errors are caused by distortion in the control signal, comprising the steps of:
    enabling the control signal input to said sequential phase detector for a relatively short enable time window comprising a small fraction of the control signal cycle period, said enable time window beginning just before a control signal is anticipated;
    limiting the response of said phase detector to the first one of any control signals from said control signal input during any given enable time window;
    disabling said control signal input for the remainder of said control signal period.

2. The method according to claim 1 wherein said phase detector provides phase comparison based on positive zero crossings of a VCO derived signal and said periodic control signal.

3. The method according to either of claims 1 or 2 further comprising the step of controlling said enabling and disabling of said control signal input to said phase detector by means of timing signals related to the frequency of the VCO and the control signal.

4. The method according to claim 3 wherein said timing signals are derived by counting down the output of the VCO of the phase-locked loop.

5. The method according to claim 3 wherein said timing signals are derived by dividing the frequency of the VCO to equal the frequency of said control signal.

6. The method according to claim 5 wherein the frequency of said control signal is 60 Hz.

7. The method according to claim 1 further comprising the step of overriding said enabling and disabling steps and reenabling the control signal input to said phase detector when said phase-locked loop is detected to be substantially out of lock.

8. The method of claim 7 further comprising the step of re-establishing the normal control of said enabling and disabling steps when said phase-locked loop regains lock.

9. A system for minimizing synchronization errors in a phase-locked loop having a sequential phase detector for determining the phase difference between the output of the VCO of the phase-locked loop and a periodic control signal having a characteristic control signal cycle period comprising:
  VCO signal input means for providing an input to said sequential phase detector indicative of the phase state of said VCO;
  control signal generating means for providing a periodic control signal indicative of the phase state of a control signal of known frequency derived from without said phase-locked loop;
  enabling means for enabling said control signal as an input to said sequential phase detector for a relatively short enable time window which comprises a small fraction of the control signal cycle period, said enable time window beginning just before a control signal is anticipated;
  disabling means for disabling said control signal input to said phase detector for the remainder of said control signal cycle period; and
  control means for controlling said enabling and disabling means.

10. The system according to claim 9 wherein said control means further comprises phase detector input logic circuit means which allows only the first of any control signals received during any given enable time window to be passed to the sequential phase detector as a signal usable by said phase detector.

11. The system according to either claim 9 or 10 wherein said control means further comprises, overriding circuit means including auxiliary phase detecting means for overriding said enabling and disabling means to re-enable said control signal prior to said time window as an input to said phase detector when said phase-locked loop is detected as being substantially out of lock with said control signal by said auxiliary phase detecting means.

12. The system according to claim 9 wherein said time window is equal to or greater than the dynamic phase error of the system.

13. The system according to claim 9 wherein said control means for controlling said enabling and disabling means further comprises:
  timing means for deriving timing signals related to the frequency of the said input control signal and the VCO of the phase-locked loop;
  logic circuit means for utilizing the output signals of said timing means to accomplish said enable and disable control functions.

14. The system according to claim 13 wherein said timing means is driven from the VCO of the phase-locked loop.

15. The system according to either of claims 13 or 14 wherein said timing means further comprises
  counting means for dividing the frequency of the VCO by a given integer and deriving a signal therefrom indicative of a particular phase state of the VCO;
  said counting means further producing an enable output indicative of a predetermined position in the counting sequence for use in activating said enabling means through said logic circuit means; and
  said counting means further producing a reset output indicative of a predetermined state in the counting sequence for use in activating said disabling means through said logic circuit means.

16. The system according to claim 15 wherein said VCO signal is counted down to the frequency of said control signal.

17. The system according to claim 16 wherein said frequency is 60 Hz.

18. The system according to claim 15 wherein said control signal is derived from a 60 Hz AC line input.

19. The system according to claim 15 wherein said enabling logic circuit means further comprises:
  first gate means adapted to be turned on upon receiving a signal indicating that said counting means has reached the beginning of said enable time window; and
  second gate means having a first input derived from the output of said first gate means and a second input comprising control signal from said control signal generating means such that a high first signal combined with a control signal enables said second gate means, said second gate means having an output connected to the phase detector input logic circuit means; and
  wherein said control means further comprises:
  phase detector input logic circuit means connected between the output of said second gate means and the control signal input of said phase detector, wherein said phase detector input logic circuit means is adapted to transmit a logic input signal to said phase detector responsive only to the first signal from said second gate means during any given enable period.

20. The apparatus according to claim 19 wherein said first and second gate means are AND gates and said phase detector input logic circuit means is a flip-flop.

21. The system according to claim 19 wherein said logic circuit means for disabling said control signal input comprises means responsive to the reset signal output of said counting means for disabling the input to said second gate means derived from the output of first gate means and resetting and thereby reenabling said phase detector input logic means.

22. The system according to claim 21 wherein said second gate is disabled prior to the reenabling of said phase detector input logic means to prevent the transmission of spurious input signals during that interim.

23. The system of claim 21 wherein said means responsive to the reset output of said counting means further comprises:
  first bistable circuit element having an input connected to the reset signal output of said counting means and having an output which resets said phase detector input logic circuit means; and
  second bistable circuit element connected between said first and second gate means.

24. The system according to claim 22 wherein said overriding circuit means further comprises:
  output comparator means having a threshold output indicative of an out-of-lock condition beyond the maximum desired for the phase-locked loop to operate, said output of said output comparator means being utilized as an overriding signal for continuously enabling said control signal as an input to said phase detector until said phase lock is reestablished and said comparator signal is disabled.

25. A system for minimizing synchronization errors in a phase-locked loop having a sequential phase detector for determining the phase difference between the output of the VCO of the phase-locked loop and a periodic control signal comprising:

VCO signal input means for providing an input to said sequential phase detector indicative of the phase state of said VCO;

control signal generating means for providing a periodic control signal indicative of the phase state of a control signal of known frequency derived from without said phase-locked loop;

enabling means for enabling said control signal as an input to said sequential phase detector for a relatively short enable time window which comprises a small fraction of the control signal cycle period, said enable time window beginning just before a control signal is anticipated;

disabling means for disabling said control signal input to said phase detector for the remainder of said control signal cycle period; and control means for controlling said enabling and disabling means, said control means further comprising:

phase detector input logic circuit means which allows only the first of any control signals received during any given enable time interval to be passed to the sequential phase detector as a signal usable by said phase detector; and overriding circuit means including auxiliary phase detecting means for overriding said enabling and disabling means to re-enable said control signal prior to said time window as an input to said phase detector when said phase-locked loop is detected as being substantially out of lock with said control signal by said auxiliary phase detecting means;

timing means for deriving timing signals related to the frequency of the said input control signal and the VCO of the phase-locked loop;

logic circuit means for utilizing the output signals of said timing means to accomplish said enable, disable and override control functions.

26. An FSK digital logic transmitter system for transmitting data via power line carrier comprising:

a phase-locked loop having a sequential phase detector;

means for FSK modulating the frequency of the VCO of the phase locked loop to produce output signals indicative of digital logic;

output amplification means for amplifying said output signals and transferring said output signals to the powerline;

means for minimizing synchronization errors in said phase-locked loop having said sequential phase detector for determining the phase difference between the output of the VCO of the phase-locked loop and a periodic control signal having a characteristic control signal cycle period further comprising:

VCO signal input means for providing an input to said sequential phase detector indicative of the phase state of said VCO;

control signal generating means for providing a periodic control signal indicative of the phase state of a control signal of known frequency derived from without said phase-locked loop;

enabling means for enabling said control signal as an input to said sequential phase detector for a relatively short enable time window which comprises a small fraction of the control signal cycle period, said enable time window beginning just before a control signal is anticipated;

disabling means for disabling said control signal input to said phase detector for the remainder of said control signal cycle period; and control means for controlling said enabling and disabling means, said control means further comprising:

phase detector input logic circuit means which allows only the first of any control signals received during any given enable time interval to be passed to the sequential phase detector as a signal usable by said phase detector; and overriding circuit means including auxiliary phase detecting means for overriding said enabling and disabling means to re-enable said control signal prior to said time window as an input to said phase detector when said phase-locked loop is detected as being substantially out of lock with said control signal by said auxiliary phase detecting means;

timing means for deriving timing signals related to the frequency of the said input control signal and the VCO of the phase-locked loop;

logic circuit means for utilizing the output signals of said timing means to accomplish said enable, disable and override control functions.

* * * * *